United States Patent [19]
Chan et al.

[11] Patent Number: 6,058,778
[45] Date of Patent: May 9, 2000

[54] INTEGRATED SENSOR HAVING PLURALITY OF RELEASED BEAMS FOR SENSING ACCELERATION

[75] Inventors: Tsiu Chiu Chan, Dallas; Melvin Joseph DeSilva, Collin, both of Tex.

[73] Assignee: STMicroelectronics, Inc., Carrollton, Tex.

[21] Appl. No.: 08/957,809

[22] Filed: Oct. 24, 1997

[51] Int. Cl.⁷ .................................................. G01P 15/135
[52] U.S. Cl. .................................... 73/514.16; 73/514.36; 257/417
[58] Field of Search ........................... 73/514.01, 514.16, 73/514.35, 514.36, 514.38, 510, 651; 200/61.48, 61.51; 257/415, 417

[56] References Cited

U.S. PATENT DOCUMENTS

| | | | |
|---|---|---|---|
| 3,727,209 | 4/1973 | White et al. | 73/514.35 |
| 3,766,616 | 10/1973 | Staudte | 29/25.35 |
| 3,969,640 | 7/1976 | Staudte | 310/9.1 |
| 4,272,840 | 6/1981 | Morozumi et al. | 368/202 |
| 4,320,320 | 3/1982 | Momosaki et al. | 310/361 |
| 4,443,116 | 4/1984 | Yoshida et al. | 368/202 |
| 4,464,061 | 8/1984 | Kamiya | 368/202 |
| 5,001,933 | 3/1991 | Brand | 73/651 |
| 5,198,716 | 3/1993 | Godshall et al. | 310/349 |
| 5,233,456 | 8/1993 | Nelson | 359/214 |
| 5,417,312 | 5/1995 | Tsuchitani et al. | 188/181 |
| 5,444,641 | 8/1995 | White | 364/484 |
| 5,463,233 | 10/1995 | Norling | 257/254 |
| 5,504,356 | 4/1996 | Takeuchi et al. | 257/254 |
| 5,506,454 | 4/1996 | Hanzawa et al. | 307/10.1 |
| 5,559,358 | 9/1996 | Burns et al. | 257/431 |
| 5,576,251 | 11/1996 | Garabedian et al. | 437/228 |
| 5,578,843 | 11/1996 | Garabedian et al. | 257/254 |
| 5,610,335 | 3/1997 | Shaw et al. | 73/514.36 |
| 5,610,337 | 3/1997 | Nelson | 73/651 |
| 5,640,133 | 6/1997 | MacDonald et al. | 333/197 |
| 5,659,195 | 8/1997 | Kaiser et al. | 257/415 |
| 5,772,322 | 6/1998 | Burns et al. | 374/118 |
| 5,772,902 | 6/1998 | Reed et al. | 216/2 |

*Primary Examiner*—John E. Chapman
*Attorney, Agent, or Firm*—Theodore E. Galanthay; Lisa K. Jorgenson; Christopher F. Regan

[57] ABSTRACT

An integrated circuit and method are provided for sensing activity such as acceleration in a predetermined direction of movement. The integrated released beam sensor preferably includes a switch detecting circuit region and a sensor switching region connected to and positioned adjacent the switch detecting circuit region. The sensor switching region preferably includes a plurality of floating contacts positioned adjacent and lengthwise extending outwardly from said switch detecting circuit region for defining a plurality of released beams so that each of said plurality of released beams displaces in a predetermined direction responsive to acceleration. The plurality of released beams preferably includes at least two released beams lengthwise extending outwardly from the switch detecting circuit region to different predetermined lengths and at least two released beams lengthwise extending outwardly from the switch detecting circuit region to substantially the same predetermined lengths. The methods of forming an integrated sensor advantageously are preferably compatible with know integrated circuit manufacturing processes, such as for CMOS circuit manufacturing, with only slight variations therefrom.

32 Claims, 5 Drawing Sheets

INTEGRATED SENSOR HAVING PLURALITY OF RELEASED BEAMS FOR SENSING ACCELERATION

FIELD OF THE INVENTION

The present invention relates to the field of integrated circuits, and, more particularly, to an integrated circuit and method having the capability of sensing activity.

BACKGROUND OF THE INVENTION

Over the years, various microelectromechanical systems ("MEMS") have arisen which require the necessity to sense temperature, pressure, strain, acceleration, rotation, infrared radiation, chemical properties of liquids and gases, and other physical inputs. Accordingly, various types of microsensors have been developed which receive analog and digital electrical inputs and also sense or measure these other physical inputs, e.g., acceleration, pressure, temperature, strain.

Integrated circuits are widely used in many of these MEMS or electronic applications. Various integrated circuit manufacturing processes, e.g., very large scale integrated ("VLSI") are also widely known and provide various advantages. The complimentary metal oxide semiconductor ("CMOS") manufacturing technology, for example, generally provides a low power dissipation advantage over known metal oxide semiconductor ("MOS") processes. Microsensor manufacturing which is compatible with known integrated circuit manufacturing processes, however, can be quite complicated, especially because of a need for integrating various types of structures at relatively low cost.

Examples of applications for microsensors for acceleration or accelerometers include air bag systems, anti-lock braking systems, and ride suspension systems for automobiles and in-flight aircraft monitoring systems for aircraft. Each of these applications requires small, inexpensive, and reliable acceleration devices.

Many of the known accelerometers for these applications, for example, are analog and measure or sense an electrical current that varies with frequency or amplitude of acceleration. In other words, in essence, many of these sensors convert mechanical parameters to other energy domains and then sense or measure directly. For sensors using direct sensing, the parameters are conventionally related to strain, stress, or displacement. The principles conventionally used to measure or sense strain are piezoelectricity, piezoresistivity, and capacitive or inductive impedance.

The measurement of piezoelectric effects, however, often requires a high input impedance amplifier to measure the surface charges or voltages generated by the stress or the strain. These types of sensors can be expensive and are often not readily acceptable for high density integrated circuit technology and various integrated circuit manufacturing technology.

The measurement of piezoresistivity in conductors and semiconductors conventionally involves the strain on the crystal structure deforming the energy band structure and, thus, changing the mobility and carrier density that changes the resistivity or orientation. These type of sensors, however, are also like piezoelectric sensors in that these sensors can be expensive to manufacture and often may not be very stable for acceleration applications.

Capacitive or inductive impedances can also be used to measure acceleration. Examples of such sensors can be seen in U.S. Pat. No. 5,417,312 by Tsuchitani et al. titled "Semiconductor Acceleration Sensor and Vehicle Control System Using The Same," U.S. Pat. No. 5,506,454 by Hanzawa et al. titled "System And Method For Diagnosing Characteristics Of Acceleration Sensor," U.S. Pat. No. 5,610,335 by Shaw et al. titled "Microelectromechanical Lateral Accelerometer," and U.S. Pat. No. 5,659,195 by Kaiser et al. titled "CMOS Integrated Microsensor With A Precision Measurement Circuit." Capacitive devices integrate the change of elementary capacitive areas while piezoresistive devices take the difference of the resistance changes of bridge arms. Accordingly, capacitive sensors are generally less sensitive to the sideways or indirect forces and are generally more stable. Capacitive sensors, however, conventionally require a capacitance-to-voltage converter on or near the chip to avoid the effects of stray capacitances which can complicate the associated circuitry. The measurement circuitry for these types of sensors is also required to be stable and have low noise.

Additionally, some accelerometers provide a digital output by using a "spring" that either makes or breaks an electrical contact in response to acceleration. Some of these spring elements, for example, may provide a series of sensing elements having incrementally higher response thresholds which make electrical contact when the threshold is reached. These "spring" accelerometers, however, are relatively large in size as compared to VLSI circuitry and can be quite difficult to make compatible with current integrated circuit manufacturing processes.

Yet further types of microsensors which provide a digital output for detecting translational or rotational acceleration are also known. An example of such a microsensor can be seen in U.S. Pat. No. 5,610,337 by Nelson titled "Method of Measuring The Amplitude And Frequency Of An Acceleration." One type of accelerometer uses a sensing element which has some sort of pivotally mounted tilting beam (see FIG. 1B therein). The pivotally mounted tilting beam includes a hinge portion, a rigid connection member connected to the hinge portion, and a pair of respective end portions, e.g., a proof mass, connected to the rigid connection member. The end portions rotate clockwise and counter clockwise during rotational, e.g., horizontal, movement. Only one of the end portions contacts a contact electrode which responsively stores the contact signal to indicate that the movement was in the one direction. In essence, this sensing element provides three-states, namely tilted contact in one direction, tilted contact in the other direction, or untilted or neutral. Such a sensing element, however, requires a reset pulse or a reset position which needs to be activated by an external reset activation source.

Another type of accelerometer which provides a digital output is also illustrated in this patent (see FIGS. 2–4). This sensing element provides a cantilever beam type arrangement that includes a thick beam, a thinner portion of flexible material connected to and extending outwardly from the thick beam and defining a hinge, and a thicker proof mass or end portion connected to and extending outwardly from the hinge. This arrangement of a cantilever beam has problems with "stuck on" conditions which also require complex reset structures and conditions. This arrangement also may include small critical dimension which can make manufacturing of such a device difficult and expensive with known integrated circuit manufacturing processes such as CMOS technology.

SUMMARY OF THE INVENTION

With the foregoing in mind, the present invention advantageously provides an integrated CMOS sensor and associated methods for sensing acceleration. The present invention also advantageously provides an integrated sensor that is readily compatible with existing integrated circuit manufacturing technology and manufacturing processes, that has greater tolerance for small critical dimensions, and that provides better signal indication when interfacing with logic of an integrated circuit. The present invention additionally provides a cost effective method of forming an integrated sensor for sensing activity desired to be sensed, such as acceleration in a predetermined direction. The present invention further advantageously provides an integrated sensor and associated methods which more reliably and more precisely sense an acceleration event.

More particularly, the present invention advantageously provides an integrated sensor for sensing acceleration in a predetermined direction. The integrated sensor preferably includes a switch detecting circuit region and a sensor switching region connected to and positioned adjacent the switch detecting circuit region. The switch detecting circuit region is preferably provided by a CMOS switch detecting circuit region, such as an inverter circuit. The sensor switching region preferably includes a plurality of floating contacts positioned adjacent and lengthwise extending outwardly from the switch detecting circuit region for defining a plurality of released beams so that each of the plurality of released beams displaces in a predetermined direction responsive to acceleration. The plurality of released beams preferably include at least two released beams lengthwise extending outwardly from the switch detecting circuit region to different predetermined lengths and at least two released beams lengthwise extending outwardly from the switch detecting circuit region to substantially the same predetermined lengths.

According to other aspects of the present invention, the sensor switching region can also include at least one fixed contact layer underlying the plurality of released beams. Preferably, each of the plurality of released beams contacts the at least one fixed contact layer responsive to acceleration in a predetermined direction so as to form a closed switch position. In turn, the switch detecting circuit region generates a signal responsive to the contact of the plurality of released beams with the at least one fixed contact layer.

Additionally, advantageously, the sensor switching region can also include remaining portions of a sacrificial layer positioned between the at least one fixed contact layer and each of the plurality of released beams. Each of the plurality of released beam is positioned in spaced relation from the at least one fixed contact layer in a normally open position. The spaced relation preferably forms by removal of unwanted portions of the sacrificial layer. Each of the plurality of released cantilever beams contacts the at least one fixed contact layer responsive to acceleration in a predetermined direction to form a closed switch position.

Also, at least one insulating layer preferably underlies the at least one fixed contact layer, and the at least one fixed contact layer is preferably a plurality of fixed contact layers. A plurality of insulating layers are also preferably positioned between an adjacent pair of the plurality of fixed contact layers for insulating each of the plurality of fixed contact layers from another one of the plurality of fixed contact layers. The remaining portions of the sacrificial layer preferably include at least one concave surface underlying each of the plurality of released beams. This concave surface, for example, can advantageously be formed by an isotropic etch to release each of the plurality of beams. The plurality of released beams can be either released cantilever beams, released beams each having a configuration including at least two supports, or a combination of these or other types of released beams.

Further, the integrated sensor can advantageously include acceleration calibrating means associated with the plurality of released beams for providing a plurality of calibrated accelerations sensed by the integrated sensor. The acceleration calibrating means preferably includes a predetermined length of each of the plurality of released beams so as to substantially correspond to a plurality of selected calibration threshold regions. Each of the plurality of selected acceleration calibration threshold regions is preferably provided by a portion of the at least one fixed contact layer substantially corresponding to a region of contact of at least one of the plurality of released beams with the at least one fixed plate.

The present invention also advantageously provides methods of forming an integrated sensor. A method of forming an integrated sensor preferably includes providing a switch detecting circuit region and forming a plurality of sensor switching regions connected to and positioned adjacent the switch detecting circuit region. Each of the sensor switching region is preferably formed by at least forming a first conducting layer of material on a support so as to define a fixed contact layer and forming a second floating contact overlying the first conducting layer so as to define a released beam.

According to one aspect of the method, the released beam preferably forms a released cantilever beam. This method, for example, can include depositing a sacrificial layer on the first conducting layer, depositing a second conducting layer on the sacrificial layer, and removing at least unwanted portions of the sacrificial layer, e.g., by etching, to release the second conducting layer so as to define the released cantilever beam.

According to another aspect of the method, the released beam preferably forms a released beam overlying the fixed contact layer so as to have a configuration including at least two supports. This method, for example, can include depositing a sacrificial layer on the first conducting layer, depositing a second conducting layer on the sacrificial layer, and removing at least unwanted portions of the sacrificial layer, e.g., by etching, to release the second conducting layer so as to define the released beam having the at least two supports.

According to other aspects of the method of forming an integrated sensor, the method can further include forming an insulating layer on the support prior to the step of forming the first conducting layer. The fixed contact layer is preferably formed of at least one of polysilicon and a metal, and the second conducting layer is also preferably formed of at least one of polysilicon and a metal.

A method of sensing an activity is also provided according to the present invention. The method preferably includes providing a switch detecting circuit region and providing a plurality of floating contacts positioned in spaced relation in a normally open position with at least one fixed contact layer. Each of the plurality of floating contacts preferably have substantially the same length. The method also includes contacting less than all of the plurality of floating contacts with the at least one fixed contact layer so as to form a closed switch position and generating an activity confirmation signal responsive to a majority of the plurality of floating contacts contacting the at least one fixed contact layer.

This method can also include the plurality of floating contacts being a first plurality of floating contacts, and the method further including providing a second plurality of floating contacts having a different length than the first plurality of contacts, contacting less than all of the second plurality of floating contacts with the at least one fixed contact layer so as to form a closed switch position, and generating an activity confirmation signal responsive to a majority of the second plurality of floating contacts contacting the at least one fixed contact layer.

Therefore, the present invention advantageously provides an integrated sensor and associated methods having a small chip area which allows arrays of sensors to be fabricated on the same die. The present invention also advantageously provides integrated sensors and methods which increase the reliability of the sensing of the activity, such as acceleration or deceleration. The fixed contact layer and the floating contact of the integrated sensor thereby advantageously provide a micro-mechanical sensing region that can readily be formed with known integrated circuit manufacturing processes.

BRIEF DESCRIPTION OF THE DRAWINGS

Some of the features, advantages, and benefits of the present invention having been stated, others will become apparent as the description proceeds when taken in conjunction with the accompanying drawings in which.

DETAILED DESCRIPTION OF PREFERRED EMBODIMENTS

Figure 1:
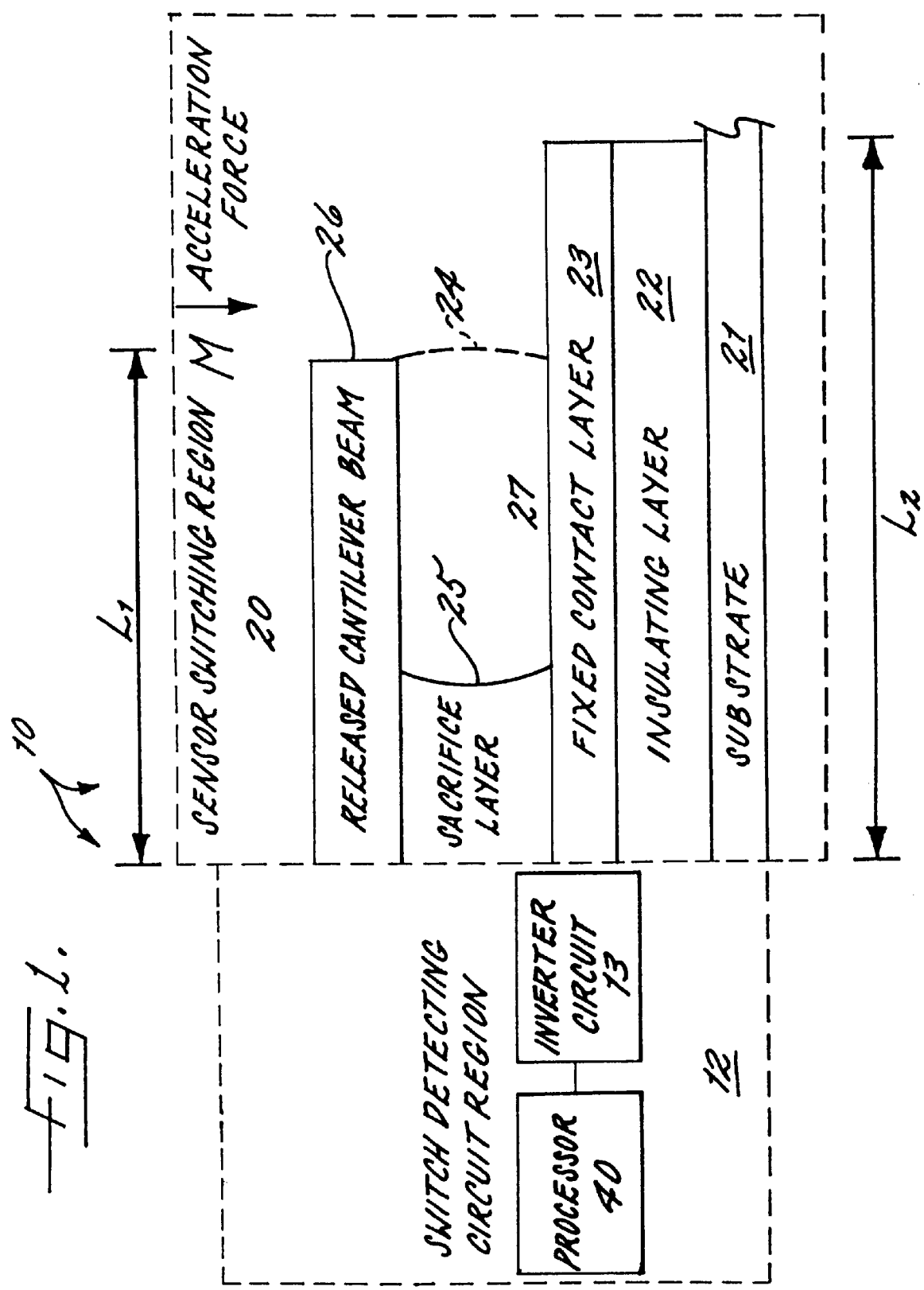
FIG. 1 is a schematic block diagram of an integrate sensor having a released cantilever beam for sensing acceleration and deceleration according to a first embodiment of the present invention.

The present invention will now be described more fully hereinafter with reference to the accompanying drawings which illustrate preferred embodiments of the invention. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art. Like numbers refer to like elements throughout, and prime or double prime notation, if used, indicates similar elements in alternative embodiments.

FIGS. 1–4 illustrate an integrated sensor 10, a microelectromechanical integrated circuit, for sensing acceleration, as well as negative acceleration or deceleration, in a predetermined direction M, generally indicated by the arrow along the direction of the force of acceleration, according to a first embodiment of the present invention. The integrated sensor 10 preferably includes a switch detecting circuit region 12 and a sensor switching region 20 connected to and positioned adjacent the switch detecting circuit region 12. The switch detecting circuit region 12 is preferably provided by a CMOS switch detecting circuit region such as an inverter circuit 13 (see, e.g., FIG. 3). The CMOS switch circuit region may also include a processor 40 connected to the inverter circuit for processing signals responsive to the inverter. The processor 40, for example, can be a processing circuit, a logic circuit, or a microprocessor or microcontroller as understood by those skilled in the art.

The sensor switching region 20 preferably includes a fixed contact layer 23, remaining portions of a sacrificial layer 24 on the fixed contact layer 23, and a floating contact 26 on remaining portions of the sacrificial layer 24 and having portions thereof directly overlying the fixed contact layer 23 in spaced relation therefrom in a normally opened position. The floating contact 26 preferably overlies the fixed contact layer 23 and extends lengthwise generally transverse to the predetermined direction or the predetermined direction of movement M so that the released beam 26 flexibly contacts the fixed contact layer 23 responsive to acceleration in the predetermined direction M to form a closed switch position. The switch detecting circuit region 12 generates a signal responsive to contact of the floating contact 26 with the fixed contact layer 23.

Figure 2:
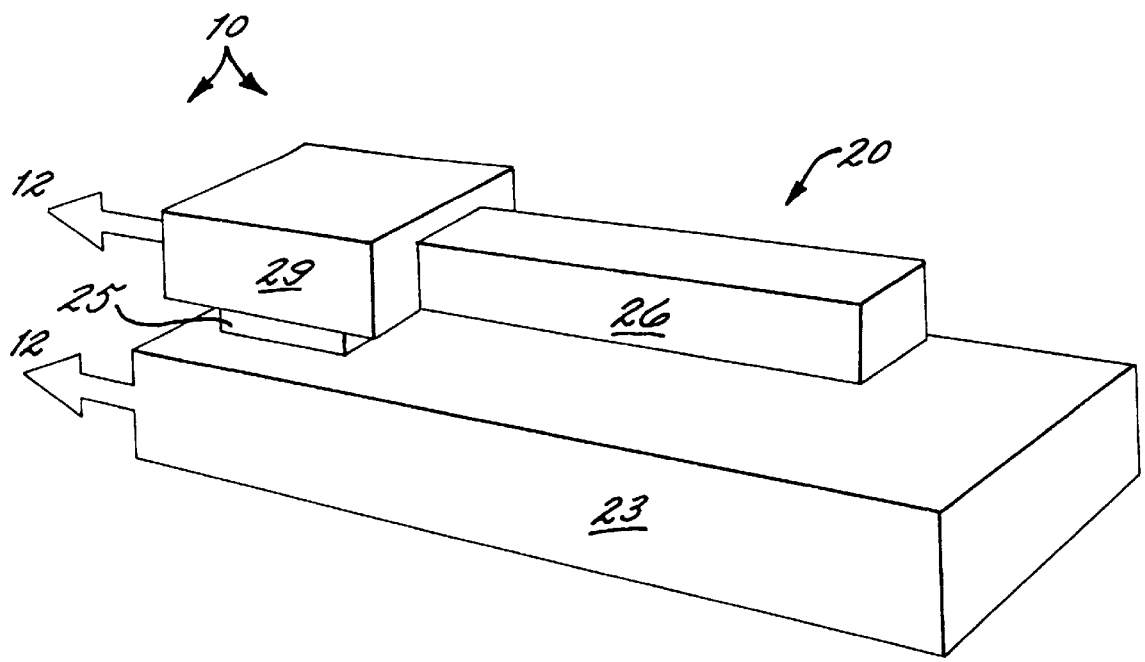
FIG. 2 is an isometric view of a sensor switching region of an integrated sensor having a released cantilever bear for sensing acceleration and deceleration according to a first embodiment of the present invention.

According to the first embodiment of the present invention, the floating contact 26 is preferably an integrally monolithic layer of material, e.g., polysilicon or a metal, has a generally uniform thickness the entire length thereof, and defines a released cantilever beam (see FIG. 2). This released cantilever configuration, for example, is formed in a generally vertical direction by having only remaining portions of a sacrificial layer 24 positioned between a first conducting layer defining the fixed contact layer 23 and a second conducting layer defining the floating contact or floating contact layer 26. The fixed contact layer 23 is preferably formed on an insulating layer 22 which, in turn, is formed on a substrate 21 or other support. The insulating layer 22 is preferably formed of a nitride layer on a field oxide or oxide layer on the substrate 21. At least portions 27 of the sacrificial layer 24 are removed so that the floating contact 26 advantageously has only one support preferably at an end 29 thereof defined by the remaining portions 25 of the sacrificial layer and thereby defining a released cantilever beam configuration (see FIG. 1). The released beam 26 flexes or flexibly moves downward due to the force of acceleration on the beam in the predetermined direction.

Figure 5:
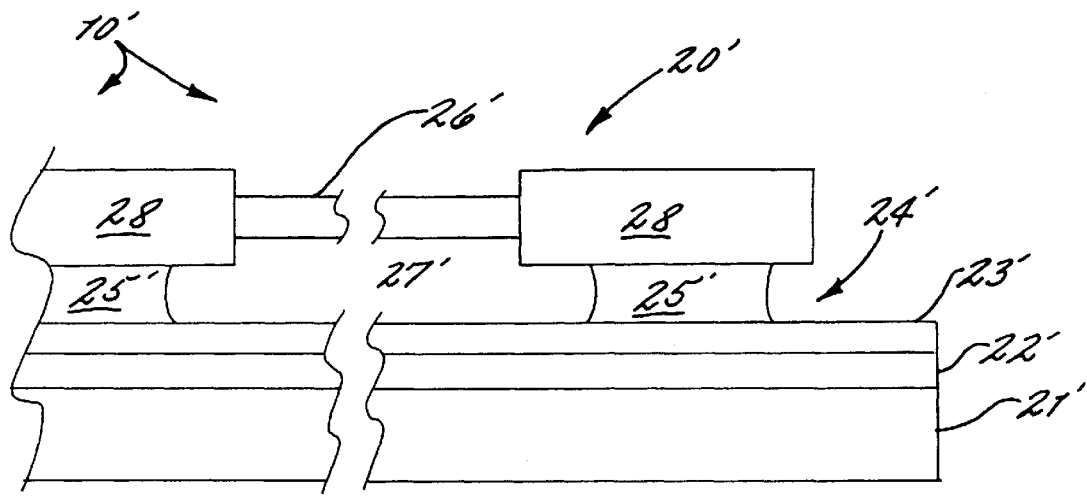
FIG. 5 is a schematic block diagram of an integrated sensor having a double-support released beam for sensing acceleration and deceleration according to a second embodiment of the present invention.

As perhaps best illustrated in FIG. 5, according to a second embodiment of an integrated sensor 10' of the present invention, the floating contact 26' of the sensor switching region 20' is a released beam overlying the fixed contact layer 23' and has a configuration which includes a plurality of supports 25'. The plurality of supports 25', for example, can be a double or dual support configuration which also forms by having a sacrificial layer 24' positioned between a first conducting layer defining the fixed contact layer 23' and a second conducting layer defining the floating contact 26'. At least portions 27' of the sacrificial layer 24' are removed, e.g., forming a window, so that the floating contact 26' has at least two supports 25', e.g., preferably on opposing ends, for the floating contact defined by the remaining portions of sacrificial layer, a window in between the opposing supported ends, and thereby defines a double support released beam configuration.

This double or dual support released beam configuration will generally have different calibration characteristics for length and thickness. The flexing or moving region of the beam 26', for example, will generally require a lot more, or an order of magnitude greater, the acceleration force for a corresponding thickness and length of the released cantilever beam configuration dependant on certain parameters, such as the vertical gap or spacing, for example. Nevertheless, the double support configuration, for example, advantageously can reduce potential "stick on" events and reduce overstress or overstrain conditions on portions of the beam 26'. The flexing or moveable portion of the beam 26' preferably has a generally uniform thickness the entire length thereof and can also have thicker portions 28 of polysilicon and/or oxide at opposing ends thereof as illustrated.

According to other aspects of the present invention, the released beam 26 of the sensor switching region 20 of the integrated sensor 10 preferably extends outwardly from the switch detecting circuit region 12 a first predetermined length L1 (see FIG. 1). The fixed contact layer 23 extends outwardly from the switch detecting circuit region 12 a second predetermined length L2. The second predetermined length L2 is preferably greater than the first predetermined length L1. This greater length L2, for example, advantageously can allow a better contact from the released beam 26 so that a signal generated by the contact with the fixed contact layer 23 responsive to acceleration in the predetermined direction more accurately indicates the closed switch position.

Figure 3:
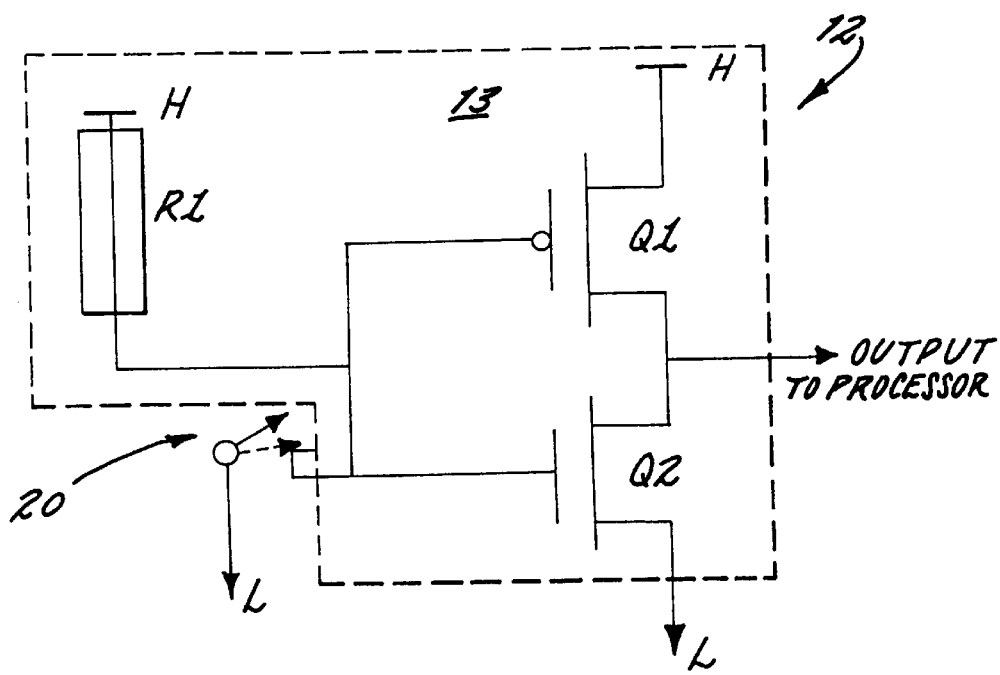
FIG. 3 is a schematic circuit diagram of an integrated sensor having a released cantilever beam for sensing acceleration and deceleration according to a first embodiment of the present invention.

FIG. 3 illustrates a schematic circuit diagram for the integrated sensor 10 according to the first and second embodiments of the present invention. The sensor switching region 20 of the integrated sensor 10 preferably operates to provide a digital output such as provided by a cantilever switch. The CMOS switch detecting region 12, for example, can be an inverter which includes a PMOS field effect transistor Q1 and an NMOS field effect transistor Q2. The circuit region 12 can also include a resistor R1, e.g., preferably provided by a poly resistor (e.g., $10^{12}$ Ohms or Teraohms), connected to the gates of the transistors Q1, Q2 of the inverter as illustrated.

Operationally, when the input across the resistor R1 is high and the switch 20 is open, e.g., no contact occurs from the released beam 26 to the fixed contact layer 23, then the output from the inverter is low. When a force from acceleration in the predetermined direction of movement occurs, the switch 20 closes and the low input is received by the inverter so that the output from the inverter is high.

Figure 4:
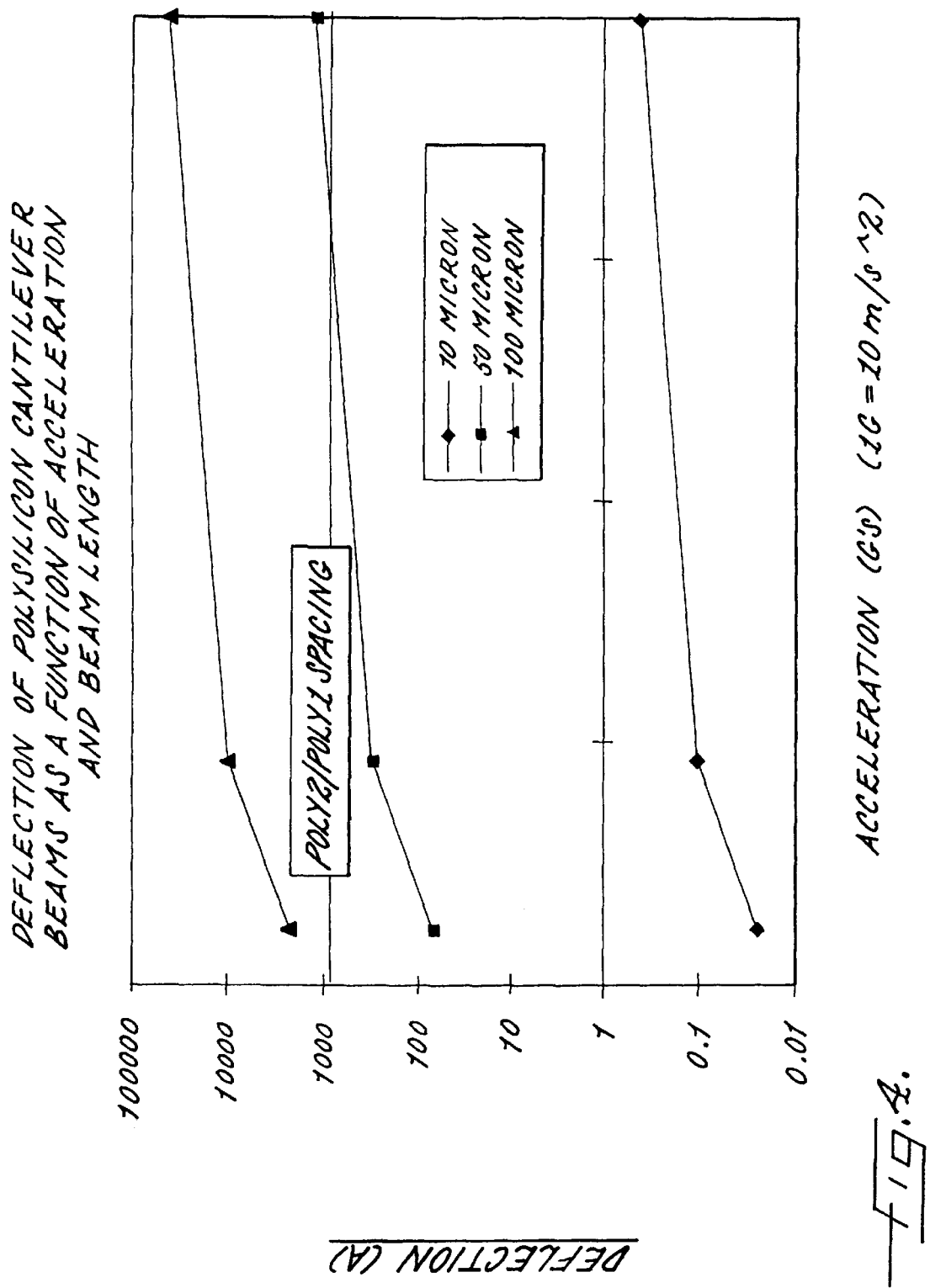
FIG. 4 is a graph of released cantilever beams as a function of acceleration and beam length for an integrated sensor according to a first embodiment of the present invention.

The integrated sensor 10 also preferably has a relationship between released cantilever beams as a function of acceleration and beam length. FIG. 4, for example, graphically illustrates the deflection of polysilicon cantilever beams as a function of acceleration and beam lengths at 10, 50, and 100 microns. The following Table 1 illustrates an example of an estimated calculation for this function which was used in the graph illustrated in FIG. 4:

| Cantilever - acceleration vs. displacement | |
| --- | --- |
| b = 1 micron | Disp = P* $(L^4)/8*E*1$ |
| H = 0.1 micron | P = M*G/b |
| L = 5, 10, 50, 100 micron | I = $(b*H^3/12)$ |
| G = 1G, 5G, 20G | M = (L*b*H) * D |

In Table 1, the bulk material properties have been assumed for the Young Modulus. It will also be understood by those skilled in the art that for the estimated calculations b is the width of the cantilever beam, H is the height of the cantilever beam, L is the length of the cantilever beam, G is the acceleration, M is the mass, D is the density, Disp is the displacement, I is the inertia, and P is the load.

| Material | E | b (width) | h (height) | L (length) | I (Inertia) | G (acceler) | D (density) | M (mass) | P (load) | Disp (cm) | Disp (A) |
| --- | --- | --- | --- | --- | --- | --- | --- | --- | --- | --- | --- |
| Si | 1.50E+12 | 1.00E−04 | 1.00E−05 | 5.00E−04 | 8.33E−21 | 1000 | 2.3 | 1.15E−12 | 1.15E−05 | 7.19E−12 | 0 |
| Si | 1.50E+12 | 1.00E−04 | 1.00E−05 | 5.00E−04 | 8.33E−21 | 5000 | 2.3 | 1.15E−12 | 5.75E−05 | 3.59E−11 | 0 |
| Si | 1.50E+12 | 1.00E−04 | 1.00E−05 | 5.00E−04 | 8.33E−21 | 20000 | 2.3 | 1.15E−12 | 0.00023 | 1.44E−10 | 0 |
| Si | 1.50E+12 | 1.00E−04 | 1.00E−05 | 1.00E−03 | 8.33E−21 | 1000 | 2.3 | 2.3E−12 | 0.000023 | 2.3E−10 | 0 |
| Si | 1.50E+12 | 1.00E−04 | 1.00E−05 | 1.00E−03 | 8.33E−21 | 5000 | 2.3 | 2.3E−12 | 0.000115 | 1.15E−09 | 0 |
| Si | 1.50E+12 | 1.00E−04 | 1.00E−15 | 1.00E−03 | 8.33E−21 | 20000 | 2.3 | 2.3E−12 | 0.00046 | 4.6E−09 | 0 |
| Si | 1.50E+12 | 1.00E−04 | 1.00E−05 | 5.00E−03 | 8.33E−21 | 1000 | 2.3 | 1.15E−11 | 0.000115 | 7019E−07 | 72 |
| Si | 1.50E+12 | 1.00E−04 | 1.00E−05 | 5.00E−03 | 8.33E−21 | 5000 | 2.3 | 1.15E−11 | 0.000575 | 3.59E−06 | 359 |
| Si | 1.50E+12 | 1.00E−04 | 1.00E−05 | 5.00E−03 | 8.33E−21 | 20000 | 2.3 | 1.15E−11 | 0.0023 | 1.44E−05 | 1438 |
| Si | 1.50E+12 | 1.00E−04 | 1.00E−05 | 1.00E−02 | 8.33E−21 | 1000 | 2.3 | 2.3E−11 | 0.00023 | 0.000023 | 2300 |
| Si | 1.50E+12 | 1.00E−04 | 1.00E−05 | 1.00E−02 | 8.33E−21 | 5000 | 2.3 | 2.3E−11 | 0.00115 | 0.000115 | 11500 |
| Si | 1.50E+12 | 1.00E−04 | 1.00E−05 | 1.00E−02 | 8.33E−21 | 20000 | 2.3 | 2.3E−11 | 0.0046 | 0.00046 | 46000 |
| Al | 7.00E+11 | 1.00E−04 | 1.00E−05 | 5.00E−04 | 8.33E−21 | 1000 | 2.7 | 1.35E−12 | 1.35E−05 | 1.81E−11 | 0 |
| Al | 7.00E+11 | 1.00E−04 | 1.00E−15 | 5.00E−04 | 8.33E−21 | 5000 | 2.7 | 1.35E−12 | 6.75E−05 | 9.04E−11 | 0 |
| Al | 7.00E+11 | 1.00E−04 | 1.00E−05 | 5.00E−04 | 8.33E−21 | 20000 | 2.7 | 1.35E−12 | 0.00027 | 3.62E−10 | 0 |
| Al | 7.00E+11 | 1.00E−04 | 1.00E−05 | 1.00E−03 | 8.33E−21 | 1000 | 2.7 | 2.7E−12 | 0.000027 | 5.79E−10 | 0 |
| Al | 7.00E+11 | 1.00E−04 | 1.00E−05 | 1.00E−03 | 8.33E−21 | 5000 | 2.7 | 2.7E−12 | 0.000035 | 2.89E−09 | 0 |
| Al | 7.00E+11 | 1.00E−04 | 1.00E−05 | 1.00E−03 | 8.33E−21 | 20000 | 2.7 | 2.7E−12 | 0.00054 | 1.16E−08 | 1 |
| Al | 7.00E+11 | 1.00E−04 | 1.00E−05 | 5.00E−03 | 8.33E−21 | 1000 | 2.7 | 1.35E−11 | 0.000135 | 1.81E−06 | 181 |
| Al | 7.00E+11 | 1.00E−04 | 1.00E−05 | 5.00E−03 | 8.33E−21 | 5000 | 2.7 | 1.35E−11 | 0.000675 | 9.04E−16 | 904 |
| Al | 7.00E+11 | 1.00E−04 | 1.00E−05 | 5.00E−03 | 8.33E−21 | 20000 | 2.7 | 1.35E−11 | 0.0027 | 3.62E−05 | 3616 |

-continued

| Material | E | b (width) | h (height) | L (length) | I (Inertia) | G (acceler) | D (density) | M (mass) | P (load) | Disp (cm) | Disp (A) |
|---|---|---|---|---|---|---|---|---|---|---|---|
| Al | 7.00E+11 | 1.00E−04 | 1.00E−05 | 1.00E−02 | 8.33E−21 | 1000 | 2.7 | 2.7E−11 | 0.00027 | 5.79E−05 | 5786 |
| Al | 7.00E+11 | 1.00E−04 | 1.00E−05 | 1.00E−02 | 8.33E−21 | 5000 | 2.7 | 2.7E−11 | 0.00135 | 0.000289 | 28929 |
| Al | 7.00E+11 | 1.00E−04 | 1.00E−05 | 1.00E−02 | 8.33E−21 | 20000 | 2.7 | 2.7E−11 | 0.0054 | 0.001157 | 115714 |

This graph of FIG. 4 and Table 1 above advantageously illustrate that various lengths of released beams can be used to detect various thresholds or values of acceleration. For example, when the release beam 26 contacts the fixed contact layer 23, such contact will occur only if a predetermined amount of acceleration force has caused the released beam 26 to deflect to the point of contact with the fixed contact layer 23.

An integrated sensor 10 according to the present invention preferably further includes acceleration calibrating means associated with the released beam 26 for calibrating acceleration sensed by the integrated sensor 10. The acceleration calibrating means preferably includes forming a predetermined length L1 of the released beam 26 so as to substantially correspond to a selected acceleration calibration threshold (see also FIG. 4). The selected acceleration calibration threshold is preferably defined by a portion of the fixed contact layer 23 substantially corresponding to a region of contact of the released beam 26 with the fixed contact layer 23. In other words, the length for a preselected thickness of the released beam 26 is preferably precalculated so that contact with the fixed contact layer 23 by the released beam 26 only occurs when the force due to acceleration reaches a predetermined threshold or a predetermined value. This contact, e.g., a closed switch position, is then detected by the switch detecting circuit region 12, e.g., by the inverter circuit so that the output is high (see FIG. 3). The length of the released beam 26, for example, advantageously can vary so that when a plurality of these switching sensors are used, various acceleration thresholds are detected.

Figure 6:
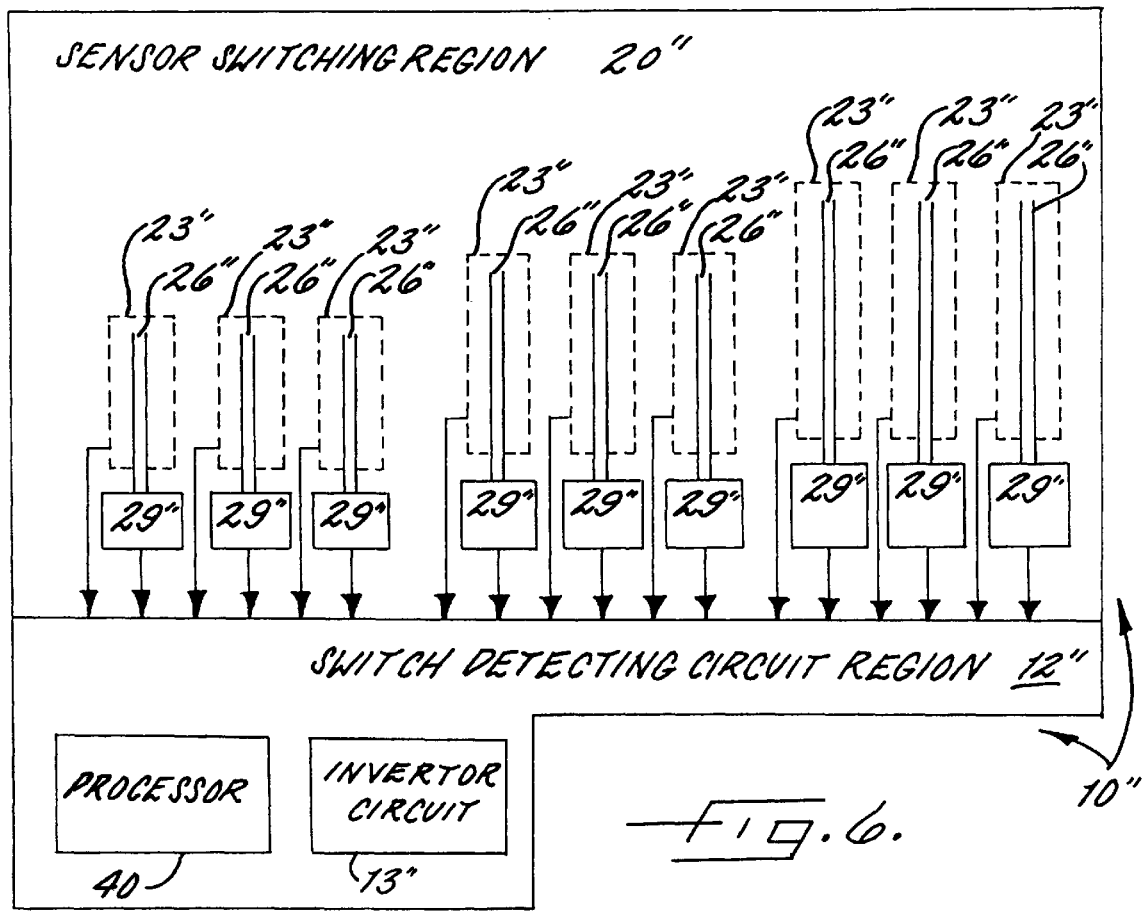
FIG. 6 is a schematic block diagram of an integrated sensor having a sensor switching region which include a plurality of released beams for sensing acceleration and deceleration according to a third embodiment of the present invention.
Figure 7:
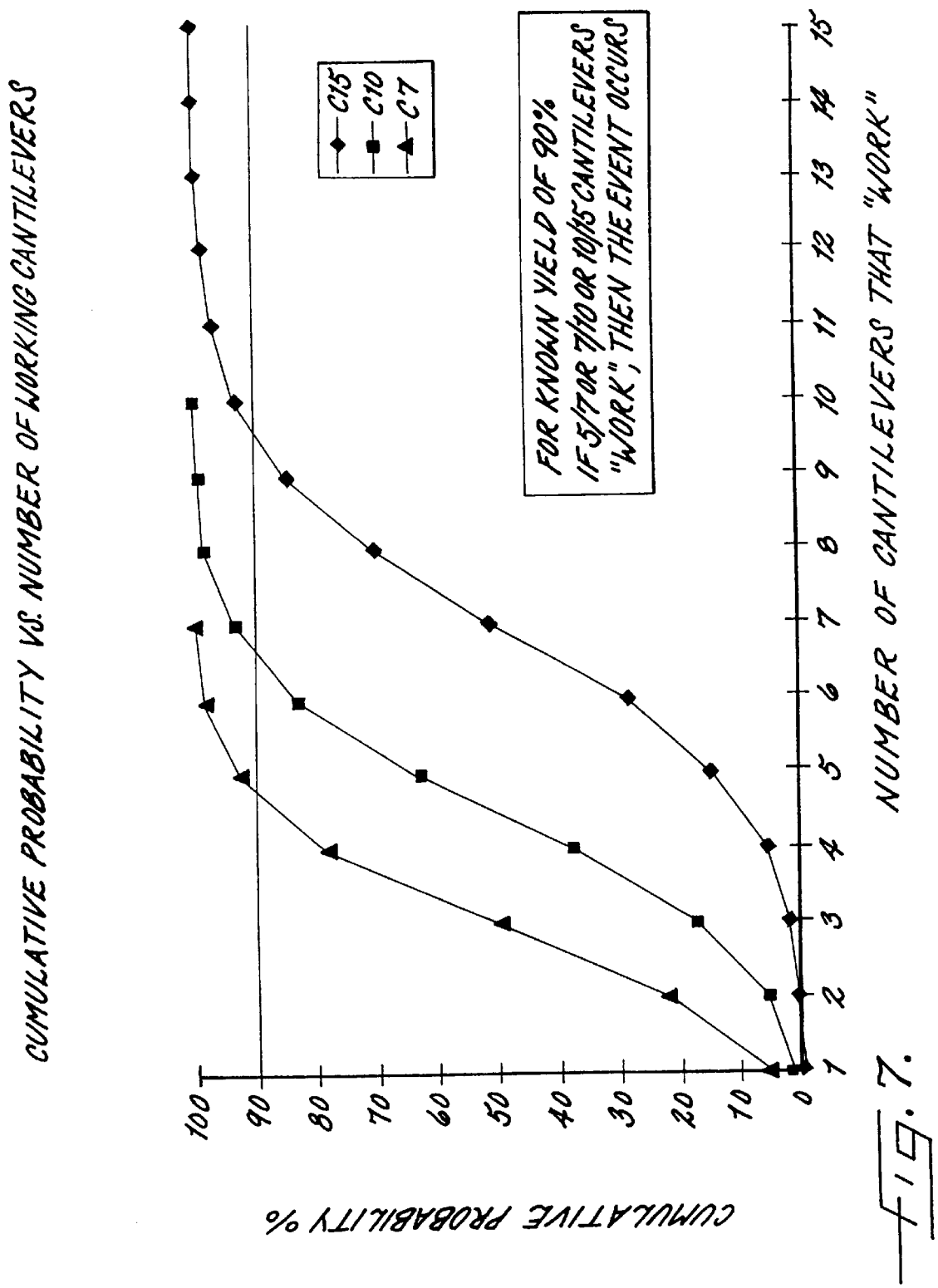
FIG. 7 is a graph of cumulative probability versus number of working cantilevers of an integrated circuit according to a third embodiment of the present invention.

As perhaps best illustrated in FIGS. 6–7, according to yet another embodiment of the present invention, an integrated sensor 10" preferably includes a switch detecting circuit region 12" and a sensor switching region 20" connected to and positioned adjacent the switch detecting circuit region 12". The sensor switching region 20" includes a plurality of floating contacts 26" positioned adjacent and lengthwise extending outwardly from the switch detecting circuit region 12" for defining a plurality of released beams so that displacement of each of the plurality of released beams 26" in a predetermined direction corresponds to sensing activity.

The integrated sensor 10", also advantageously has a relationship between cumulative probability and the number of working released cantilever beams of an integrated sensor 10". FIG. 7, for example, graphically illustrates this relationship. The following Table 2, for example, provides an illustration of estimated calculations for this relationship as graphically illustrated in FIG. 7:

| Number | nCr | Cum(nCr) | C10 | Number | nCr | Cum(nCr) | C7 |
|---|---|---|---|---|---|---|---|
| 1 | 10 | 10 | 0.977517 | 1 | 7 | 7 | 5.511811 |
| 2 | 45 | 55 | 5.376344 | 2 | 21 | 28 | 22.04724 |
| 3 | 120 | 175 | 17.10655 | 3 | 35 | 63 | 49.6063 |
| 4 | 210 | 385 | 37.63441 | 4 | 35 | 98 | 77.16535 |
| 5 | 252 | 637 | 62.26784 | 5 | 21 | 119 | 93.70079 |
| 6 | 210 | 847 | 82.7957 | 6 | 7 | 126 | 99.2126 |
| 7 | 120 | 967 | 94.5259 | 7 | 1 | 127 | 100 |
| 8 | 45 | 1012 | 98.92473 | | | | |
| 9 | 10 | 1022 | 99.90225 | | | | |
| 10 | 1 | 1023 | 100 | | | | |
| Number | nCr | Cum(nCr) | C15 | Number | C15 | C10 | C7 |
| 1 | 15 | 15 | 0.045778 | 1 | 0.045778 | 0.977517 | 5.511811 |
| 2 | 105 | 120 | 0.366222 | 2 | 0.366222 | 5.376344 | 22.04724 |
| 3 | 455 | 575 | 1.754814 | 3 | 1.754814 | 17.10655 | 49.6063 |
| 4 | 1365 | 1940 | 5.920591 | 4 | 5.920591 | 37.63441 | 77.16535 |
| 5 | 3003 | 4943 | 15.0853 | 5 | 15.0853 | 62.26784 | 93.70079 |
| 6 | 5005 | 9948 | 30.35981 | 6 | 30.35981 | 82.7957 | 90.2126 |
| 7 | 6435 | 163.83 | 49.99847 | 7 | 49.99847 | 94.5259 | 100 |
| 8 | 6435 | 22818 | 69.63713 | 8 | 69.63713 | 98.92173 | |
| 9 | 5005 | 278.33 | 84.91165 | 9 | 84.91165 | 99.90225 | |
| 10 | 3003 | 30826 | 94.07636 | 10 | 94.07636 | 100 | |
| 11 | 1365 | 32191 | 98.24213 | 11 | 98.24213 | | |
| 12 | 455 | 32646 | 99.63073 | 12 | 99.63073 | | |
| 13 | 105 | 32751 | 99.95117 | 13 | 99.95117 | | |
| 14 | 15 | 32766 | 99.99695 | 14 | 99.99695 | | |
| 15 | 1 | 32767 | 100 | 15 | 100 | | |
| | | % confidence | | | % confidence | | % confidence |
| 5/7 | >93.70 | | | 7/10 | >94.53 | 10/15 | >94.076 |
| 6/7 | >99.21 | | | 8/10 | >98.92 | 11/15 | >98.242 |

-continued

| 7/7 | >100.00 | 9/10 | >99.90 | 12/15 | >99.631 |
|-----|---------|------|--------|-------|---------|
|     |         | 10/10 | 100.00 | 13/15 | >99.951 |
|     |         |      |        | 14/15 | >99.997 |
|     |         |      |        | 15/15 | 100.000 |

The graphical illustration of FIG. 7 and Table 2 advantageously show the cumulative probability of an accurate detection, e.g., "% confidence", or read for the contact of the released beam 26" with the fixed contact layer 23". For example, if 5 out of 7, 7 out of 10 or 10 out of 15 of the released cantilever beams 26" "work" or switch closed, then at least a 90% confidence level exists that the acceleration threshold has been detected or the event has occurred. In other words, statistically probability of an event occurring can advantageously be used for forming an integrated sensor 10" having a sensor switching region 20" which includes a plurality of these released beams 26" formed as described herein.

According to aspects of this embodiment of the present invention, the plurality of released beams 26" preferably include at least two released beams 26" lengthwise extending outwardly from the switch detecting circuit region 12" to different predetermined lengths and at least two released beams 26" lengthwise extending outwardly from the switch detecting circuit region 12" to substantially the same predetermined lengths (see FIG. 6). The sensor switching region 20" can further include at least one fixed contact layer 23" underlying the plurality of released beams 26" so that at least one of the plurality of released beams 26" contacts the at least one fixed contact layer 23" during sensing of movement in a predetermined direction M so as to form a closed switch position. The sensor 20" preferably has a plurality of fixed contact layers 23' spaced apart from each other generally in the same plane and has insulating layers or insulating material positioned between each of the spaced apart fixed contact layers 23" (See FIG. 6). Like the integrated sensor 10, 10' of the first and second embodiments, the integrated sensor 10" of this embodiment also preferably has the switch detecting circuit region 12" being responsive to the contact of the at least one of the plurality of released beams 26" with the at least one fixed contact layer 23" and preferably includes a processor 40" as described above herein.

As illustrated in FIGS. 1–7, the present invention also advantageously provides methods of forming an integrated sensor 10. A method of forming an integrated sensor 10 preferably includes providing a switch detecting circuit region 12 and forming a sensor switching region 20 connected to and positioned adjacent the switch detecting circuit region 12. The sensor switching region 20 is preferably formed by at least forming a first conducting layer of material on a support so as to define a fixed contact layer 23 and forming a second floating conducting layer overlying the second conducting layer so as to define a released beam 26.

According to one aspect of the method, the released beam 26 preferably forms a released cantilever beam. This method, for example, can include depositing a sacrificial layer 24 on the first conducting layer 23, depositing a second conducting layer 26 on the sacrificial layer 24, and removing at least portions 27 of the sacrificial layer 24, e.g., preferably by dry isotropic etching or an oxide release etch as understood by those skilled in the art, to release the second conducting layer so as to define the released cantilever beam 26. This isotropic etch forms concave surfaces in the remaining portions of the sacrificial layer, including surface or surfaces underlying the released beam 26. This isotropic etch capability, for example, advantageously provides releasing of the beam 26 so that the overall integrated sensor 10 can readily be formed with known CMOS processes. Oxide (e.g., $SiO_2$) or other passivation material is also deposited on the second conducting layer, and either an isotropic or anisotropic etch used for the oxide overlying the second conducting layer, e.g., polysilicon.

According to another aspect of the method, the released beam 26' preferably forms a released beam overlying the fixed contact layer 23' so as to have a configuration including at least two supports 25'. This method, for example, can include depositing a sacrificial layer 24' on the first conducting layer 23', depositing a second conducting layer 26' on the sacrificial layer 24', and removing at least portions 27' of the sacrificial layer 24', e.g., by etching, to thereby defined a window and to thereby release the second conducting layer so as to define the released beam having the at least two supports 25'. A nitride mask, for example, can be used in the process.

According to other aspects of the method of forming an integrated sensor 10, the method can further include forming an insulating layer or plate 22, e.g., preferably provided by a nitride layer or a nitride layer on a field oxide, on the support plate 21 prior to the step of forming the first conducting layer 23. The nitride layer, for example, advantageously protects the underlying field oxide during the release etch. If the polysilicon pads are sufficiently layer, however, then the nitride layer may not be needed over the field. The fixed contact layer 23 is preferably formed of at least one of polysilicon and a metal, and the second floating conducting layer 26 is also preferably formed of at least one of polysilicon and a metal. Both the fixed contact layer and the released beam are preferably formed of polysilicon material so that they can advantageously be readily formed when other CMOS switch detecting circuitry is being formed, e.g., a continuous process, wherein other polysilicon material is conventionally used. Both the fixed contact layer and the released beam are also connected to the switch detecting circuit region 12 as illustrated in FIGS. 1–3 and 5–6.

For example, in forming the integrated sensor 20 according to a method of the invention, a wafer or substrate can be prepared and an initial field oxide layer for a target thickness. A nitride layer can then be deposited on the oxide layer. Most of the CMOS switch detecting circuit region 12 is preferably formed prior to the sensor switching region 20 because more is involved. These processes can include etching and implant using masks as understood by those skilled in the art. The sensor switching region can then be prepared and formed in process with the switch detecting circuit region 12. The first polysilicon layer can be deposited, and a layer of oxide, e.g., the sacrificial layer 24, deposited on the first polysilicon layer. The second polysilicon layer can then be deposited and, for example, also used for a local interconnect, a resistor, and the beam 26. Additional, preparation of the switch detecting region can be performed, e.g., implanting, depositing, and etching, and then the window in the sacrificial layer can be etched, e.g., by using a high frequency vapor oxide release etch or an isotropic dry vapor oxide release etch, so that the cantilever beam 26 or the double support beam 26' remain floating.

A method of sensing an activity is also provided according to the present invention. The method preferably includes providing a switch detecting circuit region 12" and providing a plurality of floating contacts 26" positioned in spaced relation in a normally open position with at least one fixed contact layer 23". Each of the plurality of floating contacts 26" preferably has substantially the same length. The method also includes contacting less than all of the plurality of floating contacts 26" with the at least one fixed contact layer 23" so as to form a closed switch position and generating an activity confirmation signal responsive to a majority of the plurality of floating contacts 26" contacting the at least one fixed contact layer 23".

As perhaps best illustrated in FIGS. 6–7, this method can also include the plurality of floating contacts 26" being a first plurality of floating contacts, and the method further including providing a second plurality of floating contacts having a different length than the first plurality of contacts, contacting less than all of the second plurality of floating contacts with the at least one fixed contact layer 23" so as to form a closed switch position, and generating an activity confirmation signal responsive to a majority of the second plurality of floating contacts contacting the at least one fixed contact layer 23".

As illustrated and described herein, the integrated sensor 10, 10', 10" of the present invention advantageously provides an integrated sensor and associated methods having a small chip area which allows arrays of sensors to be fabricated on the same die. The present invention also advantageously provides integrated sensors and methods which increase the reliability of the sensing of the activity such as the acceleration and deceleration. The fixed contact layer 23, 23', 23" and the floating contact 26, 26', 26" of the integrated sensor 10, 10', 10" thereby advantageously provide a micromechanical sensing region 20, 20', 20" that can readily be formed with known integrated circuit manufacturing processes as understood by those skilled in the art.

The various embodiments of the integrated sensor 10, 10', 10" and its associated methods, including methods of forming the same, may also be advantageously used for other applications as well. For example, other integrated circuitry having related structures are illustrated in the following copending patent applications: (1) "Integrated Released Beam Sensor For Sensing Acceleration And Associated Methods," having attorney work docket number 18978, having U.S. Ser. No. 08/957,768, assigned to the assignee of the present invention, and the entire disclosure of which is incorporated herein by reference in its entirety; (2) "Integrated Released Beam Oscillator And Associated Methods," having attorney work docket number 18981, having U.S. Ser. No. 08/957,804, assigned to the assignee of the present invention, and the entire disclosure of which is incorporated herein by reference in its entirety; and (3) "Integrated Released Beam, Thermo-Mechanical Sensor for Sensing Temperature Variations And Associated Methods," having attorney work docket number 18979, having U.S. Ser. No. 08/957,802 now issued U.S. Pat. No. 5,917,226, assigned to the assignee of the present invention, and the entire disclosure of which is incorporated herein by reference in its entirety.

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

That which is claimed:

1. An integrated sensor comprising:

a switch detecting circuit region; and a sensor switching region connected to and positioned adjacent said switch detecting circuit region, said sensor switching region including;

a plurality of floating contacts positioned adjacent and lengthwise extending outwardly from said switch detecting circuit region for defining a plurality of released beams so that each of said plurality of released beams displaces in a predetermined direction responsive to acceleration, said plurality of released beams including at least two released beams lengthwise extending outwardly from said switch detecting circuit region to different predetermined lengths and at least two released beams lengthwise extending outwardly from said switch detecting circuit region to substantially the same predetermined lengths, each of said plurality of released beams comprising a integrally monolithic material having a generally uniform thickness extending substantially the entire length thereof, at least one fixed contact layer underlying said plurality of released beams, and remaining portions of at least one sacrificial layer positioned between said at least one fixed contact layer and each of said plurality of released beams, each of said plurality of released beams being positioned in spaced relation from said at least one fixed contact layer in a normally open position, the spaced relation forming by removal of unwanted portions of the sacrificial layer, and each of said plurality of released beams contacting said at least one fixed contact layer responsive to acceleration in a predetermined direction to form a closed switch position.

2. An integrated sensor as defined in claim 1, wherein said switch detecting circuit region generates a signal responsive to the contact of said at least one of said plurality of released beams with said at least one fixed contact layer.

3. An integrated sensor as defined in claim 2, wherein said sensor switching region further comprises at least one insulating support plate underlying said at least one fixed contact layer.

4. An integrated sensor as defined in claim 3, wherein said remaining portions of the at least one sacrificial layer includes at least one concave surface underlying each of said plurality of released beams.

5. An integrated sensor as defined in claim 4, wherein said at least one fixed contact layer comprises polysilicon or a metal.

6. An integrated sensor as defined in claim 1, wherein said sensor switching region further comprises a plurality of fixed contact layers each underlying a corresponding one of said plurality of released beams, and wherein each of said plurality of released beams contacts the corresponding respective one of said plurality of fixed contact layers responsive to acceleration in a predetermined direction so as to form a closed switch position, and wherein said switch detecting circuit region is responsive to the contact of each of said plurality of released beams with each of said plurality of fixed contact layers.

7. An integrated sensor as defined in claim 6, wherein said sensor switching region further comprises at least one insulating support layer underlying at least one of said plurality of fixed contact layers and a plurality of insulating layers each positioned between an adjacent pair of the plurality of fixed contact layers for insulating each of said plurality of fixed contact layers from another one of said plurality of fixed contact layers.

8. An integrated sensor as defined in claim 7, wherein said sensor switching region further comprises remaining portions of at least one sacrificial layer positioned between each of said plurality of fixed contact layers and each of said plurality of released beams, wherein each of said plurality of released beam is positioned in spaced relation from a corresponding one of said plurality of fixed contact layers in a normally open position, the spaced relation forming by removal of unwanted portions of the at least one sacrificial layer, and wherein each of said plurality of released cantilever beams contacts said at least one fixed contact layer responsive to acceleration in a predetermined direction to form a closed switch position.

9. An integrated sensor as defined in claim 8, wherein each of said plurality of fixed contact layers comprises at least one of polysilicon and a metal.

10. An integrated sensor as defined in claim 1, wherein at least one of said plurality of released beams comprises a released cantilever beam.

11. An integrated sensor as defined in claim 10, wherein said released cantilever beam comprises polysilicon.

12. An integrated sensor as defined in claim 1, wherein at least one of said plurality of released beams comprises a released beam having a configuration including at least two supports having thicker portions of the same material forming the released beam positioned at opposing ends thereof.

13. An integrated sensor as defined in claim 12, wherein said released beam comprises polysilicon or a metal.

14. An integrated sensor as defined in claim 1, further comprising acceleration calibrating means associated with said plurality of released beams for providing a plurality of calibrated accelerations sensed by the integrated sensor, said acceleration Calibrating means including different predetermined length of each of said plurality of released beams so as to substantially correspond to a plurality of different preselected calibration threshold regions.

15. An integrated sensor as defined in claim 14, wherein said sensor switching region further includes at least one fixed contact layer underlying said plurality of released beams, and wherein each of the plurality of selected acceleration calibration threshold regions comprises a portion of said at least one fixed contact layer substantially corresponding to a region of contact of at least one of said plurality of released beams with said at least one fixed contact layer.

16. An integrated sensor as defined in claim 15, wherein the predetermined lengths of the outward extent of said plurality of released beams comprise a first plurality of predetermined lengths, wherein said at least one fixed contact layer extends outwardly from said switch detecting circuit region a second predetermined length, and wherein the second predetermined length is greater than at least one of the first plurality of predetermined lengths.

17. An integrated sensor comprising:
a switch detecting circuit region; and
a sensor switching region connected to and positioned adjacent said switch detecting circuit region, said sensor switching region including:

a plurality of floating contacts positioned adjacent and lengthwise extending outwardly from said switch detecting circuit region for defining a plurality of released beams so that each of said plurality of released beams displaces in a predetermined direction responsive to acceleration, said plurality of released beams including at least two released beams lengthwise extending outwardly from said switch detecting circuit region to different predetermined lengths and at least two released beams lengthwise extending outwardly from said switch detecting circuit region to substantially the same predetermined lengths, each of said plurality of relesed beams comprising an integrally monolithic material having a generally uniform thickness extending substantially the entire length thereof.

18. An integrated sensor as defined in claim 17, wherein said sensor switching region further comprises at least one fixed contact layer underlying said plurality of released beams, and wherein at least one of said plurality of released beams contacts said at least one fixed contact layer responsive to acceleration in a predetermined direction so as to form a closed switch position, and wherein said switch detecting circuit region generates a signal responsive to the contact of said at least one of said plurality of released beams with said at least one fixed contact layer.

19. An integrated sensor as defined in claim 18, wherein said sensor switching region further comprises at least one insulating layer underlying said at least one fixed contact layer.

20. An integrated sensor as defined in claim 19, wherein said sensor switching region further comprises remaining portions of a sacrificial layer positioned between said at least one fixed contact layer and each of said plurality of released beams, wherein each of said plurality of released beam is positioned in spaced relation from said at least one fixed contact layer in a normally open position, the spaced relation forming by removal of unwanted portions of the sacrificial layer, and wherein each of said plurality of released beams contacts said at least one fixed contact layer responsive to acceleration in a predetermined direction to form a closed switch position.

21. An integrated sensor as defined in claim 20, wherein said at least one fixed contact layer comprises polysilicon go a metal.

22. An integrated sensor as defined in claim 17, wherein said sensor switching region further comprises a plurality of fixed contact layers each underlying a corresponding one of said plurality of released beams, and wherein each of said plurality of released beams contacts the corresponding respective one of said plurality of fixed contact layers responsive to acceleration in a predetermined direction so as to form a closed switch position, and wherein said switch detecting circuit region is responsive to the contact of each of said plurality of released beams with each of said plurality of fixed contact layers.

23. An integrated sensor as defined in claim 22, wherein said sensor switching region further comprises at least one insulating support layer underlying at least one of said plurality of fixed contact layers and a plurality of insulating layers each positioned between an adjacent pair of the plurality of fixed contact layers for insulating each of said plurality of fixed contact layers from another one of said plurality of fixed contact layers.

24. An integrated sensor as defined in claim 23, wherein said sensor switching region further comprises remaining portions of at least one sacrificial layer positioned between each of said plurality of fixed contact layers and each of said plurality of released beams, wherein each of said plurality of released beam is positioned in spaced relation from a corresponding one of said plurality of fixed contact layers in a normally open position, the spaced relation forming by removal of unwanted portions of the at least one sacrificial layer, and wherein each of said plurality of released beams contacts said at least one fixed contact layer responsive to acceleration in a predetermined direction to form a closed switch position.

25. An integrated sensor as defined in claim 24, wherein each of said plurality of fixed contact layers comprises polysilicon or a metal, and wherein said remaining portions of the at least one sacrificial layer includes at least one concave surface underlying each of said plurality of released beams.

26. An integrated sensor as defined in claim 17, wherein at least one of said plurality of released beams comprises a released cantilever beam.

27. An integrated sensor as defined in claim 26, wherein said released cantilever beam comprises polysilicon.

28. An integrated sensor as defined in claim 17, wherein at least one of said plurality of released beams comprises a released beam having a configuration including at least two supports having thicker portions of the same material forming the released beam positioned at opposing ends thereof.

29. An integrated sensor as defined in claim 28, wherein said released beam comprises polysilicon or a metal.

30. An integrated sensor as defined in claim 17, further comprising acceleration calibrating means associated with said plurality of released beams for providing a plurality of calibrated accelerations sensed by the integrated sensor, said acceleration calibrating means including a predetermined length of each of said plurality of released beams so as to substantially correspond to a plurality of preselected calibration threshold regions.

31. An integrated sensor as defined in claim 30, wherein said sensor switching region further includes at least one fixed contact layer underlying said plurality of released beams, and wherein each of the plurality of selected acceleration calibration threshold regions comprises a portion of said at least one fixed contact layer substantially corresponding to a region of contact of at least one of said plurality of released beams with said at least one fixed contact layer.

32. An integrated sensor as defined in claim 31, wherein the predetermined lengths of the outward extent of said plurality of released beams comprise a first plurality of predetermined lengths, wherein said at least one fixed contact layer extends outwardly from said switch detecting circuit region a second predetermined length, and wherein the second predetermined length is greater than at least one of the first plurality or predetermined lengths.

\* \* \* \* \*